(12) United States Patent
Frolov et al.

(10) Patent No.: US 10,043,929 B1
(45) Date of Patent: Aug. 7, 2018

(54) SPECTRALLY ADAPTIVE MULTIJUNCTION PHOTOVOLTAIC THIN FILM DEVICE AND METHOD OF PRODUCING SAME

(71) Applicant: Sunlight Photonics Inc., Edison, NJ (US)

(72) Inventors: Sergey Frolov, Murray Hill, NJ (US); Allan James Bruce, Scotch Plains, NJ (US); Joseph Shmulovich, New Providence, NJ (US)

(73) Assignee: Sunlight Photonics Inc., Edison, NJ (US)

( * ) Notice: Subject to any disclaimer, the term of this patent is extended or adjusted under 35 U.S.C. 154(b) by 0 days.

(21) Appl. No.: 14/146,207

(22) Filed: Jan. 2, 2014

Related U.S. Application Data

(62) Division of application No. 13/074,390, filed on Mar. 29, 2011, which is a division of application No. 11/714,681, filed on Mar. 6, 2007, now abandoned.

(51) Int. Cl.
*H01L 31/0725* (2012.01)
*H01L 31/076* (2012.01)
(Continued)

(52) U.S. Cl.
CPC .......... *H01L 31/042* (2013.01); *H01L 31/043* (2014.12); *H01L 31/076* (2013.01); *H01L 31/078* (2013.01); *H01L 31/0725* (2013.01)

(58) Field of Classification Search
USPC ................................................. 136/243–265
See application file for complete search history.

(56) References Cited

U.S. PATENT DOCUMENTS

| 2,949,498 A | 8/1960 | Jackson |
| 3,978,510 A | 8/1976 | Kasper et al. |

(Continued)

FOREIGN PATENT DOCUMENTS

| GB | 2400725 | 10/2004 |
| JP | 56165365 | 12/1981 |

(Continued)

OTHER PUBLICATIONS

PTO translation of JP 57-153478, 2010.*
(Continued)

*Primary Examiner* — Kevin E Yoon
(74) *Attorney, Agent, or Firm* — Stuart H. Mayer; Mayer & Williams PC

(57) ABSTRACT

A method is provided for converting optical energy to electrical energy in a spectrally adaptive manner. The method begins by directing optical energy into a first photovoltaic module that includes non-single crystalline semiconductor layers defining a junction such that a first spectral portion of the optical energy is converted into a first quantity of electrical energy. A second spectral portion of the optical energy unabsorbed by the first module is absorbed by a second photovoltaic module that includes non-single crystalline semiconductor layers defining a junction and converted into a second quantity of electrical energy. The first quantity of electrical energy is conducted from the first module to a first external electrical circuit along a first path. The second quantity of electrical energy is conducted from the second module to a second external electrical circuit along a second path that is in parallel with the first path.

11 Claims, 3 Drawing Sheets

(51) Int. Cl.
*H01L 31/078* (2012.01)
*H01L 31/042* (2014.01)
*H01L 31/043* (2014.01)

(56) References Cited

U.S. PATENT DOCUMENTS

| | | | |
|---|---|---|---|
| 4,094,704 | A | 6/1978 | Milnes |
| 4,335,266 | A | 6/1982 | Mickelsen et al. |
| 4,338,480 | A | 7/1982 | Antypas et al. |
| 4,387,265 | A | 6/1983 | Dalal |
| 4,477,721 | A | 10/1984 | Chappell et al. |
| 4,686,323 | A | 8/1987 | Biter et al. |
| 4,798,660 | A | 1/1989 | Erner et al. |
| 4,984,439 | A | 1/1991 | Smejda |
| 5,071,490 | A | 12/1991 | Yokota et al. |
| 5,223,043 | A | 6/1993 | Olson et al. |
| 5,282,902 | A | 2/1994 | Matsuyama |
| 5,282,993 | A | 2/1994 | Karg |
| 5,441,897 | A | 8/1995 | Noufi et al. |
| 5,445,847 | A | 8/1995 | Wada et al. |
| 5,458,694 | A * | 10/1995 | Nuyen ............... H01L 31/1844 136/249 |
| 5,482,569 | A | 1/1996 | Ihara et al. |
| 5,567,469 | A | 10/1996 | Wada et al. |
| 5,626,688 | A | 5/1997 | Probst et al. |
| 5,902,417 | A | 5/1999 | Lillington et al. |
| 5,985,691 | A | 11/1999 | Basol |
| 6,107,562 | A | 8/2000 | Hashimoto et al. |
| 6,258,620 | B1 | 7/2001 | Morel et al. |
| 6,340,789 | B1 | 1/2002 | Petritsch et al. |
| 6,534,704 | B2 | 3/2003 | Hashimoto et al. |
| 6,559,372 | B2 | 5/2003 | Stanbery |
| 6,974,976 | B2 | 12/2005 | Hollars |
| 7,235,736 | B1 | 6/2007 | Buller et al. |
| 7,537,955 | B2 | 5/2009 | Basol |
| 8,124,870 | B2 * | 2/2012 | Woods ............ H01L 31/022425 136/256 |
| 2002/0043279 | A1 | 4/2002 | Karg |
| 2003/0047207 | A1 | 3/2003 | Aylaian |
| 2003/0234038 | A1 | 12/2003 | Kurokami et al. |
| 2004/0045598 | A1 | 3/2004 | Narayanan et al. |
| 2004/0084077 | A1 | 5/2004 | Aylaian |
| 2004/0211458 | A1 * | 10/2004 | Gui et al. ....................... 136/244 |
| 2005/0056312 | A1 | 3/2005 | Young et al. |
| 2005/0150542 | A1 | 7/2005 | Madan |
| 2005/0236032 | A1 | 10/2005 | Aoki |
| 2005/0266600 | A1 | 12/2005 | Basol |
| 2005/0268957 | A1 * | 12/2005 | Enomoto et al. ............. 136/244 |
| 2005/0271827 | A1 | 12/2005 | Krunks et al. |
| 2006/0194371 | A1 | 8/2006 | Okazaki et al. |
| 2006/0211272 | A1 | 9/2006 | Lee et al. |
| 2006/0270236 | A1 | 11/2006 | Kusumoto et al. |
| 2007/0012353 | A1 | 1/2007 | Fischer et al. |
| 2007/0173034 | A1 | 7/2007 | Tsurume et al. |
| 2008/0057203 | A1 | 3/2008 | Robinson et al. |
| 2008/0121277 | A1 | 5/2008 | Robinson et al. |
| 2008/0121724 | A1 | 5/2008 | Beer et al. |
| 2008/0124831 | A1 | 5/2008 | Robinson et al. |
| 2009/0107555 | A1 | 4/2009 | Van Durgen et al. |
| 2009/0162969 | A1 | 6/2009 | Basol |
| 2009/0229666 | A1 | 9/2009 | Corneille et al. |
| 2009/0250105 | A1 | 10/2009 | Lee |
| 2010/0029036 | A1 | 2/2010 | Robinson et al. |
| 2010/0129957 | A1 | 5/2010 | Frolov et al. |
| 2010/0140101 | A1 | 6/2010 | Aksu et al. |
| 2010/0180935 | A1 | 7/2010 | Chen |
| 2010/0184249 | A1 | 7/2010 | Chen |
| 2011/0039366 | A1 | 2/2011 | Basol et al. |

FOREIGN PATENT DOCUMENTS

| | | |
|---|---|---|
| JP | 57153478 | 9/1982 |
| JP | 11-272753 | 10/1999 |
| JP | 2000-091613 | 3/2000 |
| JP | 2001308354 | 11/2001 |
| JP | 2003-282916 | 10/2003 |
| JP | 2004103834 | 4/2004 |
| JP | 2006024574 | 1/2006 |
| WO | 2010138635 | 12/2010 |

OTHER PUBLICATIONS

European Search Report dated Nov. 21, 2012 in connection with corresponding European Patent Application No. 08726292.9.
Kim, NP et al. "Low Cost CuInSe2 Based Solar Cells for Space Applications," Aerospace Power Systems, pp. 314-320, Aug. 4, 1991.
Kanellos, "Silicon vs. CIGS: With solar energy, the issue is material", http://msn-cnet.com.com/Silicon+vs.+CIGS+With+solar+energy,+the+issue+is+material/2100-1008_3-6121488.html, Oct. 2, 2008.

* cited by examiner

US 10,043,929 B1

SPECTRALLY ADAPTIVE MULTIJUNCTION PHOTOVOLTAIC THIN FILM DEVICE AND METHOD OF PRODUCING SAME

CROSS REFERENCE TO RELATED APPLICATION

This application claims the benefit of co-pending U.S. patent application Ser. No. 13/074,390, filed Mar. 29, 2011 and U.S. patent application Ser. No. 11/714,681, filed Mar. 6, 2007, now abandoned, the contents of which are incorporated herein by reference in their entirety.

BACKGROUND

Field

The following relates to photovoltaic devices and methods of producing such devices. More particularly, the following relates to photovoltaic devices that have substantially improved optical spectral responsivity and efficiency, and that can be produced by laminating or otherwise integrating multiples of discrete photovoltaic devices.

Related Art

Photovoltaic devices represent one of the major sources of environmentally clean and renewable energy. They are frequently used to convert optical energy into electrical energy. Typically, a photovoltaic device is made of one semiconducting material with p-doped and n-doped regions. The conversion efficiency of solar power into electricity of this device is limited to a maximum of about 37%, since photon energy in excess of the semiconductor's bandgap is wasted as heat. A photovoltaic device with multiple semiconductor layers of different bandgaps is more efficient: an optimized two-bandgap photovoltaic device has the maximum solar conversion efficiency of 50%, whereas a three-bandgap photovoltaic device has the maximum solar conversion efficiency of 56%. Realized efficiencies are typically less than theoretical values in all cases.

Multi-layered or multi junction devices are currently manufactured as monolithic wafers, where each semiconductor layer is crystal-grown on top of the previous one. As a result, the semiconductor layers are electrically connected in series and have to be current-matched, in order to obtain maximum conversion efficiency. This current-matching procedure complicates the design and decreases the efficiency of the device. The latter becomes particularly evident when considering the effect of spectral filtering on the device efficiency. If a part of the solar spectrum is absorbed or scattered, e.g. by water vapors, the resulting disproportional decrease of photocurrent in one of junctions will limit the current through the whole device and thus decrease its conversion efficiency.

SUMMARY

An apparatus for spectrally adaptive photovoltaic energy conversion device, insensitive to current matching effects, and a method for producing the same are provided. The apparatus includes a substrate, a plurality of thin-film single-junction photovoltaic layers disposed on said substrate and a plurality of electrical contacts to each of said layers. The plurality of photovoltaic layers may be semi-conducting and have different respective bandgaps so as to increase the conversion efficiency of the device. The said layers may further be at least partially transparent in the spectral energy range below their respective bandgaps. The said layers may further be electrically isolated from each other. The plurality of electrical contacts is arranged to receive independent electrical currents from each of the photovoltaic layers, so as to further increase conversion efficiency and provide spectrally adaptive capabilities of a device with respect color and intensity variations in incident or absorbed light.

In accordance with another aspect of the invention, a method is provided for converting optical energy to electrical energy in a spectrally adaptive manner. The method begins by directing optical energy into a first photovoltaic module that includes non-single crystalline semiconductor layers defining a junction such that a first spectral portion of the optical energy is converted into a first quantity of electrical energy. A second spectral portion of the optical energy unabsorbed by the first module is absorbed by a second photovoltaic module that includes non-single crystalline semiconductor layers defining a junction and converted into a second quantity of electrical energy. The first quantity of electrical energy is conducted from the first module to a first external electrical circuit along a first path. The second quantity of electrical energy is conducted from the second module to a second external electrical circuit along a second path that is in parallel with the first path.

In accordance with another aspect of the invention, a method is provided for converting optical energy with a given spectral profile to electrical energy. The method begins by receiving optical energy on an uppermost module of a photovoltaic device that includes a plurality of modules stacked one on top of another. A first spectral portion of the optical energy is converted to electrical energy. The uppermost module has a first fill factor determined in part by the given spectral profile of the first spectral portion of the optical energy. A remaining portion of the optical energy is transferred to a second module located below the uppermost module. At least a fraction of the remaining portion of the optical energy is converted to electrical energy. The second module has a second fill factor largely independent of the first fill factor of the uppermost module and determined in part by the given spectral profile of the remaining spectral portion of the optical energy.

DETAILED DESCRIPTION

Overview

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

As summarized above and described in more detail below, the apparatus for spectrally adaptive photovoltaic energy conversion device and the method for producing the same is provided. Embodiments of this apparatus and method may facilitate the ability to efficiently and economically convert electro-magnetic energy in the form of light into electrical energy in the form of electrical current. Embodiments of this apparatus and method may also facilitate large volume production and widespread usage of photovoltaic devices.

This invention utilizes thin-film technology as an alternative method of producing a multi junction photovoltaic device. As well known in the art, multi junction devices in general are a more efficient means for conversion solar energy into electricity. However, the development of these devices is currently hindered by the complexity of semiconductor manufacturing processes and their high cost. On the other hand, thin-film processing is substantially less complex and expensive. Using new design approaches and thin-film technology, a new efficient photovoltaic device with expanded capabilities and application range can be produced.

Typically, single-crystal semiconductors are grown epitaxially, layer-by-layer on a monolithic wafer. Thin-film materials, in contrast, depending on their chemical origin can be deposited and layered by a variety of different methods, using for example evaporation, sputtering, spraying, inkjet printing etc., some of which could be very inexpensive. Furthermore, some thin-film layers can be produced separately and then integrated hybridly using bonding, lamination and other similar methods. Alternatively, in some cases the entire structure may be sequentially grown without the need for any mechanical integration of the individual layers. This flexibility in a manufacturing method makes it possible to implement new design approaches in producing a better photovoltaic device.

Figure 1:
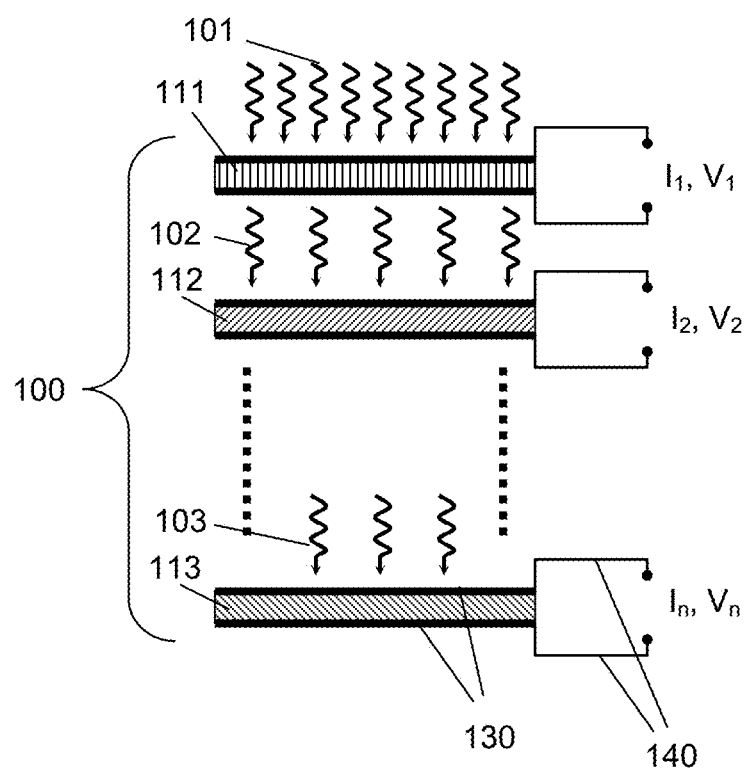
FIG. 1 is a schematic diagram of a thin-film multi junction photovoltaic device with spectrally adaptive capabilities.

Specifically, a multi-layered and multi junction photovoltaic device 100 may be produced as shown in FIG. 1, in which each junction layer (111, 112 and 113) includes a single junction with an optically active semiconductor having a specific bandgap. Of course, each so-called junction layer includes at least two sublayers that define a junction at their interface. The junction may be a heterojunction in which the sublayers are formed of dissimilar materials. Alternatively, the junction may be of any type known in the art such as, but not limited to, p-i-n junctions, MIS junctions and the like. The number of junction layers, n, may be larger than two. Also, the semiconductor material may be, for example, a compound semiconductor formed from an inorganic, polymer-based material, an organic dye-based material, a nanoparticle composite material, a quantum dot composite material, or a mixture of the above materials. Said junction layers are situated in a stack one above another in said multi-layered device. When this photovoltaic device is illuminated by light 101, each one of its junction layers may absorb a part of light with photon energies above a corresponding bandgap and transmit a part of light with photon energies below a corresponding bandgap (102 and 103). These junction layers may be arranged so that the bandgaps of lower lying junctions are smaller than the bandgaps of higher lying junctions; this condition improves the conversion efficiency of the device. Furthermore, these junction layers may be electrically isolated from each other and provided with at least two individual electrical contacts 130 of opposite polarity for producing electrical current. All the junction layers may be attached to a common substrate that may be sturdy yet flexible. The substrate also may be coated with a reflective layer. One or more surfaces in this device could be textured to provide a relief pattern for multiple light reflections and scattering, which increase absorption length and improve conversion efficiency.

Thin-film technology greatly simplifies the production of a multi-junction, non-single crystalline (e.g., polycrystalline, amorphous) photovoltaic device. Furthermore, it enables the production of large area, single-sheet, photovoltaic multi junction devices. The latter is not possible using a standard single-crystal semiconductor technology due to the typically limited and small size of semiconductor wafers. Thin-film layers formed from various compound semiconductors may be manufactured as large sheets and laminated, or otherwise joined, together to form a single large area, low-cost device. Moreover, one may define a figure-of-merit for a photovoltaic device as the ratio of its conversion efficiency to the manufacturing cost per unit area:

a. FOM=Efficiency/Cost (1)

One may also see using Eq. 1, that thin-film non-single crystalline multi junction devices will provide the highest attainable FOM. Indeed, their conversion efficiency is estimated to be in the range of 30% to 50% and comparable to that of a single crystal multi junction device, whereas a single junction thin-film photovoltaic device has efficiency of less than 20%. Yet at the same time, their manufacturing cost is estimated to be two orders of magnitude lower than that of a single crystal multi junction device. Thus, it is estimated that FOM of thin-film multi junction devices could be about 100 times larger than that of a single crystal multi junction device and 3-5 times larger than that of a single junction thin-film device.

Current approaches to the design of multi junction devices usually result in production of serially connected junctions. As a result, an electrical current through each junction must be the same; this is a condition called current matching and it is accomplished by careful selection of semiconductor bandgaps and layer thicknesses given a predetermined shape of the light spectrum. This current matching unduly complicates the design of the device, reduces its fault tolerance and may also reduce its conversion efficiency. For example, a failure of one junction will result in a failure of the whole device. Furthermore, under changing environmental conditions the spectrum of light used for energy conversion may change substantially. This effect may in turn lead to disproportionately different changes of current in different junctions, thus breaking the current matching condition and reducing conversion efficiency. For example, if an increase of moisture content in terrestrial atmosphere leads to 50% reduction of infrared portion of sunlight optical energy due to optical filtering effect, then a typical single crystal multi junction device with Ge as a bottom layer active material may experience an overall 50% reduction in its output current. In this situation the bottom-most junction will limit the current provided by the whole device because the current in the upper junction or junctions cannot exceed this value even though they would be able to do so otherwise. As a result, the fill factor of the upper junction or junctions will be substantially reduced and the overall conversion efficiency of the device will decrease.

To overcome the problems arising from serially connected junctions, this invention further improves photovoltaic conversion technology by providing separate contact layers 130 and electrical contacts 140 for each junction layer in thin-film multijunction device. Each contact pair 140 acts as a separate, independent photovoltaic source, thus producing n sets of currents and voltages: from $I_1$ and $V_1$, $I_2$ and $V_2$, to $I_n$ and $V_n$, where n is the number of junctions. This provision eliminates the need for the current matching condition, which in turn results in a simpler design and manufacturing process, a more robust and fault tolerant performance, higher conversion efficiency and an adaptive capability with respect to changes in the spectral content of light used for conversion. More specifically, the latter property of the multijunction photovoltaic device, referred to as spectral adaptation, allows the photovoltaic device to operate at its maximum possible efficiency regardless of any optical filtering effects that may occur during its operation. That is, with spectral adaptation, if the spectral content or profile of the optical energy changes, the conversion efficiency of the device will not decrease to as large an extent as it would if the junctions in the device were required to be current matched. This is because the fill factor of each junction can be largely tailored to the spectral content of the optical energy independent of the other junctions in the device. Also, a failure of any of the thin-film junction layers will not result in failure of the whole device, since they are electrically isolated.

An additional benefit of this modular manufacturing approach is that a toolbox of individual cell components with different bandgaps could be separately developed and that the set of such cells used in a multijunction device may be specifically selected to maximize the performance for different illumination conditions including AM0 (Space) without any significant change to the manufacturing approach or processing. It is further conceived that a single manufacturing line could be used for a family of products.

Examples

Figure 2:
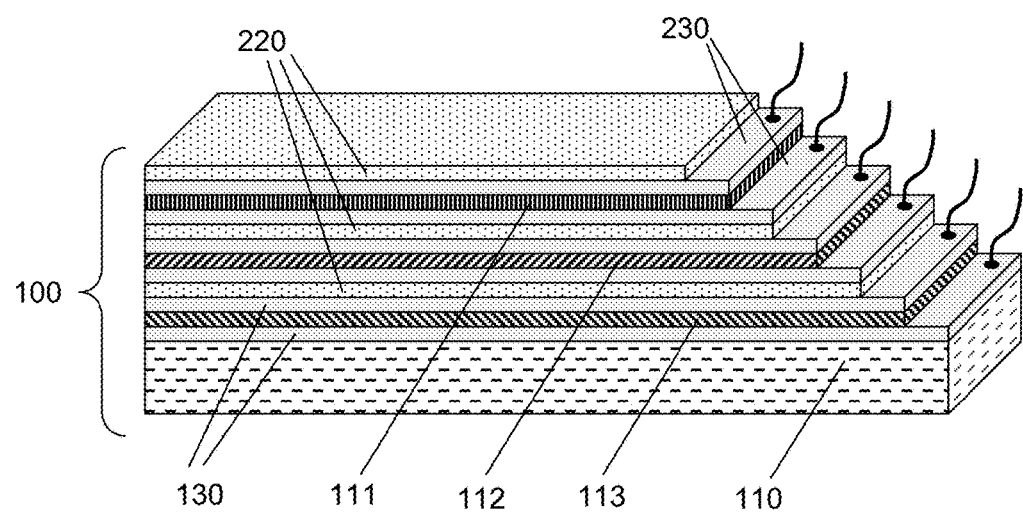
FIG. 2 is a cross-section of a multi-layered multi junction photovoltaic thin film stack.

FIG. 2 shows an exemplary embodiment of this invention, in which three different junction layers 111, 112 and 113 are utilized. Maximum sunlight power conversion efficiency of this architecture is about 56% for highly concentrated sunbeam and about 50% for regular sunlight intensity (so called condition AM1.5). All three layers contain active polycrystalline semiconductor materials based, for example, on a CIGS (Copper Indium Gallium Selenide) material system or a related alloy, and the corresponding junctions are produced using single-junction designs known in the art. By varying the In and Ga relative concentrations the bandgaps in layer 111 may be adjusted to about 1.7 eV, in layer 112—to about 1.4 eV and in layer 113—to about 1.1 eV. The thickness of each layer may be in the range of 1 to 10 microns. Each junction layer may also contain buffer layers, such as, for example, a thin CdSe layer with a thickness in the range of 10 to 1000 nm. Each junction layer may be located between appropriately matched transparent conducting layers 130. The conducting layers 130 may be formed from thin layers of ITO or ZnO with a thickness in the range of 0.1 to 5 m. Adjacent conducting layers may be separated by an electrical insulator layer 220, which is optically transparent in the appropriate spectral range. For example, electrically insulating layers may comprise thin films of polymer coating with a thickness in the range of 0.5 to 10 microns. For purposes of clarity in what follows, each junction layer (e.g., junction layers 111,112 and 113) along with its associated conducting layer from time to time may be referred to as a single module. That is, the photovoltaic device shown in FIG. 2 is formed from three such modules.

The various modules shown in FIG. 2 may be laminated together on a common carrier substrate 110, such as a thin polyimide film with a thickness in the range of 25 to 500 microns. The substrate may be coated with metal such as Al to reflect unabsorbed light back into the individual junction modules. The junction modules may be staggered or laterally offset from one another so that each conducting layer 130 has an exposed region 230. The exposed regions 230, which may be covered with metal to provide better conductivity, serve as surfaces that can connect the modules to external electrical circuits. As a result, the three modules shown in the device of FIG. 2 may have up to six electrical output connectors.

In another embodiment, the apparatus and method described above and shown in FIG. 2 may be modified, so that the bandgaps of junction layers 111, 112 and 113 are 1.8 eV, 1.2 eV and 0.8 eV, respectively. This bandgaps selection is close to the optimum set of three bandgaps for a multijunction photovoltaic device with optimized conversion efficiency.

In yet another embodiment, the apparatus and method described above and shown in FIG. 2 may be modified, so that the active semiconducting material used in producing one or more junction layers is other than the CIGS-based material. This material may be for example CdTe. In another version of this embodiment this material may be a semiconducting polymer material, such as for example poly-phenylene-vinylene and its derivatives. A variety of other known and previously mentioned semiconducting materials may be chosen without departing from the scope of the invention.

In yet another embodiment, the apparatus and method described above and shown in FIG. 2 may be modified, so that the substrate is transparent and is attached on the top of the first junction layer 111.

In yet another embodiment, the apparatus and method described above and shown in FIG. 2 may be modified, so that said junction layers are attached to individual insulating and transparent substrates providing mechanical support such that the common substrate is not necessary.

In yet another embodiment, the apparatus and method described above and shown in FIG. 2 may be modified, so that three of electrical output connectors may be shorted or connected to the ground without loss of device functionality.

In yet another embodiment, the apparatus and method described above and shown in FIG. 2 may be modified, so that additional junction layers with different bandgaps may be laminated with additional individual electrical contacts. In this embodiment the total number of junctions and bandgaps may be greater than four, and the bandgap values are chosen to maximize device conversion efficiency for a given number of junctions.

In yet another embodiment, the apparatus and method described above and shown in FIG. 2 may be modified, so that said junction layers may be produced on separate sacrificial substrates and detached from these substrate before or during the lamination process.

In yet another embodiment, the apparatus and method described above and shown in FIG. 2 may be modified, so that said junction layers may be bonded together to produce a single multi-layered photovoltaic film.

In yet another embodiment, the apparatus and method described above and shown in FIG. 2 may be modified, so that said junction layers may be glued together to produce a single multi-layered photovoltaic film.

In yet another embodiment, the apparatus and method described above and shown in FIG. 2 may be modified, so that intermediate insulating material may have a refractive index matched to the surrounding layers, in order to minimize light reflections at layer interfaces in appropriate regions of the optical spectrum.

In yet another embodiment, the apparatus and method described above and shown in FIG. 2 may be modified, so that said conducting layers 130 may be covered with a patterned grid of highly conductive metal, such as Cu or Al, to decrease electrical resistance of the corresponding contact layers without substantial decrease in optical transmissivity of the corresponding contact layers.

In yet another embodiment, the apparatus and method described above and shown in FIG. 2 may be modified, so that the reflective surface of the bottom substrate may be textured so that reflected light is scattered and absorbed by junction layers more efficiently.

In yet another embodiment, the apparatus and method described above and shown in FIG. 2 may be modified, so that the bottom substrate may be textured and non-uniform so as to provide a textured and non-uniform pattern for all junction layers in order to increase light absorption by junction layers.

In yet another embodiment, the apparatus and method described above and shown in FIG. 2 may be modified, so that the bottom substrate may be transparent and its bottom surface may be reflective and textured in order to increase light scattering and absorption.

In yet another embodiment, the apparatus and method described above and shown in FIG. 2 may be modified, so that the multi-layered multijunction film has an area larger than 400 cm$^2$.

In yet another embodiment, the apparatus and method described above and shown in FIG. 2 may be modified, so that at least one electrical contact pair from a junction layer is connected to an individual electrical grid which improves conversion efficiency of the whole photovoltaic film.

In yet another embodiment, the apparatus and method described above and shown in FIG. 2 may be modified, so that each electrical contact pair from corresponding junction layers is connected to an individual electrical grid which improves conversion efficiency of the whole photovoltaic film.

In yet another embodiment, the apparatus and method described above and shown in FIG. 2 may be modified, so that each electrical contact pair from corresponding junction layers is connected to a DC-to-DC voltage converter.

In yet another embodiment, the apparatus and method described above and shown in FIG. 2 may be modified, so that each electrical contact pair from corresponding junction layers is connected to a DC-to-AC voltage converter.

Figure 3:
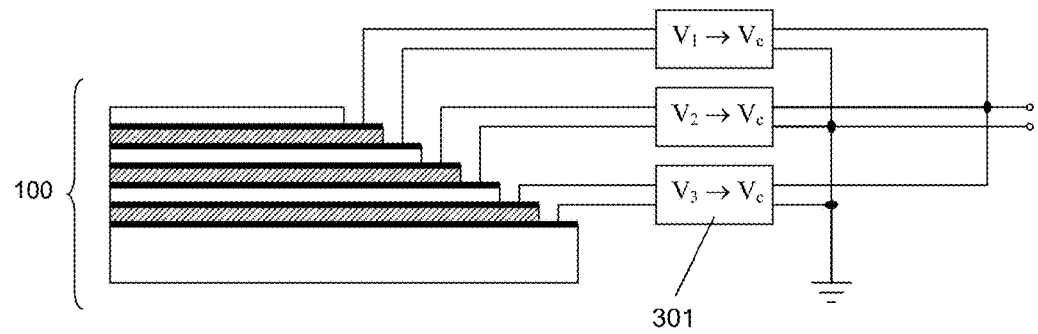
FIG. 3 is a schematic diagram for external electrical connections providing a single voltage electrical terminal.

In yet another embodiment, the apparatus and method described above and shown in FIG. 2 may be modified, so that each electrical contact pair from corresponding junction layers is connected to a voltage converter. Each voltage converter 301 may convert a different junction voltage to a common voltage, so that all junction layers may be connected in parallel without loss of functionality as shown in FIG. 3 thus providing only two output terminals.

In yet another embodiment, the apparatus and method described above and shown in FIG. 2 may be modified, so that said junction layers are subdivided into different sections and electrically connected in series to provide a higher output voltage.

Variations of the apparatus and method described above are possible without departing from the scope of the invention.

What is claimed is:

1. A method of forming a spectrally adaptive photovoltaic device, comprising:
    forming on a substrate a first photovoltaic module that includes first and second conductive layers and at least first and second CIGS-based semiconductor layers disposed between the first and second conductive layers, said first and second CIGS-based semiconductor layers defining a first junction at an interface therebetween such that the first junction converts a first spectral portion of optical energy into an electrical voltage;
    forming an insulating layer over the first photovoltaic module; and
    forming on the insulating layer a second photovoltaic module that includes third and fourth conductive layers and at least third and fourth CIGS-based semiconductor layers disposed between the third and fourth conductive layers, said third and fourth CIGS-based semiconductor layers defining a second junction at an interface therebetween such that the second junction converts a second spectral portion of optical energy into an electrical voltage, wherein said modules are initially produced on different sacrificial substrates.

2. The method of claim 1 further comprising independently selecting values of output voltages and currents for each of said photovoltaic modules to enhance their respective individual fill factors, wherein said values of output voltages and currents depend at least on part on a spectral profile of said optical energy.

3. The method device of claim 1 where said modules are hybridly attached to each other.

4. The method of claim 1 where said modules are laminated to each other.

5. The method of claim 1 where said modules are bonded to each other.

6. The method of claim 1 wherein each module has an area larger than about 400 cm$^2$.

7. The method of claim 1 further comprising forming first and second pairs of electrical contacts for receiving the electrical voltage from the first and second junctions, respectively, the first and second pairs of electrical contacts being separate and independent from one another.

8. The method of claim 1 wherein the first, second, third and fourth conductive layers are transparent thin film layers.

9. The method of claim 8 wherein the transparent thin film layers comprise ITO or ZnO thin film layers.

10. A method of forming a spectrally adaptive photovoltaic device, comprising:
    forming on a substrate a first photovoltaic module that includes first and second conductive layers and at least first and second semiconductor layers disposed between the first and second conductive layers, said first and second semiconductor layers defining a first junction at an interface therebetween such that the first junction converts a first spectral portion of optical energy into an electrical voltage;
    forming an insulating layer over the first photovoltaic module; and
    forming on the insulating layer a second photovoltaic module that includes third and fourth conductive layers and at least third and fourth semiconductor layers disposed between the third and fourth conductive layers, said third and fourth semiconductor layers defining a second junction at an interface therebetween such that the second junction converts a second spectral portion of optical energy into an electrical voltage, wherein said first and second photovoltaic modules are initially produced on different sacrificial substrates, the first, second third and fourth semiconductor layers being formed from a common semiconductor material.

11. A method of forming a spectrally adaptive photovoltaic device, comprising:

forming on a substrate a first photovoltaic module that includes first and second conductive layers and at least first and second semiconductor layers disposed between the first and second conductive layers, said first and second semiconductor layers defining a first junction at an interface therebetween such that the first junction converts a first spectral portion of optical energy into an electrical voltage;

forming an insulating layer over the first photovoltaic module; and forming on the insulating layer a second photovoltaic module that includes third and fourth conductive layers and at least third and fourth semiconductor layers disposed between the third and fourth conductive layers, said third and fourth semiconductor layers defining a second junction at an interface therebetween such that the second junction converts a second spectral portion of optical energy into an electrical voltage, wherein said first and second photovoltaic modules are hybridly attached to each other, the first, second third and fourth semiconductor layers being formed from a common semiconductor material.

* * * * *